(12) United States Patent  (10) Patent No.: US 6,955,410 B1
Nelson et al.  (45) Date of Patent: Oct. 18, 2005

(54) TECHNIQUES FOR INTERCONNECTING ELECTRONIC CABINET FRAMES

(75) Inventors: Erik C. Nelson, Upton, MA (US); Fernando Luis Castro, Natick, MA (US)

(73) Assignee: EMC Corporation, Hopkinton, MA (US)

( * ) Notice: Subject to any disclaimer, the term of this patent is extended or adjusted under 35 U.S.C. 154(b) by 189 days.

(21) Appl. No.: 10/402,883

(22) Filed: Mar. 28, 2003

(51) Int. Cl.$^7$ .............................................. A47B 97/00
(52) U.S. Cl. ...................................................... 312/352
(58) Field of Search ............................... 312/352, 198, 312/107, 108, 111, 140

(56) References Cited

U.S. PATENT DOCUMENTS

| | | | |
|---|---|---|---|
| 3,877,764 A | | 4/1975 | Hillier .......................... 312/107 |
| 4,433,881 A | * | 2/1984 | Witten et al. .............. 312/107.5 |
| 4,597,599 A | * | 7/1986 | Bisbing ........................ 292/174 |
| 4,856,150 A | * | 8/1989 | Johnson ........................ 24/287 |
| 5,702,166 A | | 12/1997 | Lee ............................ 312/107 |
| 5,938,302 A | * | 8/1999 | Anderson et al. ........ 312/223.1 |
| 6,443,542 B1 | | 9/2002 | Lindquist et al. ........... 312/198 |
| 6,678,161 B1 | | 1/2004 | Claprood et al. ........... 361/724 |

* cited by examiner

Primary Examiner—James O. Hansen
(74) Attorney, Agent, or Firm—David E. Huang, Esq.

(57) ABSTRACT

An electronic system has electronic equipment (e.g., data storage equipment), and an electronic cabinet assembly which is configured to support the electronic equipment. The electronic cabinet assembly includes a first electronic cabinet frame defining a first set of electronic equipment bays to carry a first portion of the electronic equipment, and a second electronic cabinet frame defining a second set of electronic equipment bays to carry a second portion of the electronic equipment. The electronic cabinet assembly further includes a set of latch subassemblies which is configured to selectively (i) interconnect the first and second electronic cabinet frames, and (ii) disconnect the first and second electronic cabinet frames from each other. Accordingly, a user is capable of conveniently attaching the electronic cabinet frames together using the set of latch subassemblies, and optionally separating the electronic cabinet frames at a later time, without handling any nuts or bolts.

17 Claims, 8 Drawing Sheets

TECHNIQUES FOR INTERCONNECTING ELECTRONIC CABINET FRAMES

BACKGROUND OF THE INVENTION

A typical electronic cabinet has a frame, a set of wheels that support the frame over a floor surface, and a set of panels that mount over the frame. Such a cabinet is generally well-suited for housing electronic circuitry such as a general purpose computer, network hardware, specialized equipment, etc. In particular, the wheels enable a user to conveniently move the electronic circuitry from one location to another (e.g., the wheels enable the user to roll the cabinet across a computer room floor during installation or relocation of the electronic circuitry). Furthermore, the set of panels (e.g., doors, side members, etc.) protect the electronic circuitry against damage (e.g., prevents external objects or bystanders from inadvertently contacting the electronic circuitry, discourages tampering, etc.).

Equipment manufacturers often provide electronic cabinets in standard sizes. That is, manufacturers typically provide frames having horizontal and vertical rails which support both the electronic circuitry and the panels, and which define standard-sized interior cavity dimensions and standard-sized external footprints for the electronic cabinets. One conventional standard-sized electronic cabinet defines an interior cavity, commonly called a "bay", that is approximately 19 inches wide and 28 inches deep. Such a cabinet provides a "footprint" that is roughly 23 inches wide and 30 inches deep.

A manufacturer typically scales the cabinet height and the number of bays based on the volume of equipment. For example, if there is a moderate amount of electronic circuitry, the manufacturer can provide the circuitry within a "full-height" cabinet, e.g., a cabinet which is roughly 70 to 90 inches tall. However, if there is only a small amount of electronic circuitry, the manufacturer can provide the circuitry within a "half-height" cabinet, e.g., a cabinet which is roughly 36 to 50 inches tall.

In some situations, the amount of equipment may exceed the internal volume provided by a full-height cabinet. In such situations, the manufacturer typically provides an electronic equipment cabinet that defines multiple bays (e.g., two bays or three bays). For such cabinets, the manufacturer assembles individual frames which define each bay, and then secures the individual frames rigidly together. Portions of the electronic circuitry within the bay of each frame can communicate through electrical connections (e.g., bus bars, cables, etc.) passing through openings where the frames attach. One conventional approach to securing individual cabinet frames together involves the manufacturer welding the rails of the frames together. Another conventional approach to securing individual cabinet frames together involves the manufacturer bolting the rails of the frames together using nuts and bolts.

SUMMARY

Unfortunately, there are deficiencies to the above-described conventional approaches to providing multiple-bay electronic cabinets. For example, in the conventional approach which involves welding the rails of the individual frames together, the frames end up being permanently attached to each other. As a result, the manufacturer no longer has the option of subsequently separating the frames to accommodate particular situations. For instance, the manufacturer may make a mistake while measuring the facilities at a customer location during a pre-installation analysis (commonly referred to as a "pre-site audit") and, due to the large size of the electronic cabinet, later find that it does not fit through a doorway or around a corner of a hallway, or perhaps discover that the cabinet does not fit in an elevator. In such situations, the customer typically must either structurally modify the installation location (e.g., temporarily cut a larger opening through a doorway and later repair the doorway, etc.) or call off the sale with the manufacturer.

Additionally, the manufacturer may over estimate the demand for multiple-bay equipment cabinets and make too many. At this point, since the rails of the frames are welded together, the manufacture cannot separate and recycle the frames. Rather, the manufacturer is forced to store the excess supply of multiple-bay equipment cabinets and bear the risk that the multiple-bay equipment cabinets may become obsolete while in storage.

Furthermore, in the above-described conventional approach which involves bolting the rails of the individual frames together using nuts and bolts, the manufacturer is required to handle separate and loose parts, i.e., the nuts and bolts. For instance, if the manufacturer decides to attach the individual frames together at the customer's site, the manufacturer must ship the electronic cabinet in separate pieces and hope that the nuts and bolts are still available after shipping (e.g., hope that the nuts and bolts are not lost by the shipper or inadvertently misplaced by the installer). Moreover, regardless of whether the manufacturer attaches the individual frames at the customer's site or at the manufacturer's site, there is always a risk that a piece of loose hardware (i.e., a nut or a bolt, or both) could inadvertently drop into the electronic circuitry and cause damage as well as pose a safety concern (e.g., the dropped hardware could provide a short circuit between bus bars or power supply terminals, damage a circuit board, etc.).

The invention is directed to techniques for interconnecting electronic cabinet frames using a set of latch subassemblies. Such subassemblies provide a manufacturer with flexibility to selectively interconnect and disconnect electronic cabinet frames without handling any nuts or bolts. Accordingly, the manufacturer is capable of subsequently separating electronic cabinet frames to accommodate particular situations (e.g., narrow facilities at a customer location, a reduced demand for large-scale equipment configurations, etc.) as well as avoid the risks associated with handling loose hardware (e.g., avoid loosing nuts and bolts during shipping, dropping a nut or a bolt into electronic circuitry, etc.).

One embodiment of the invention is directed to an electronic system having electronic equipment (e.g., data storage equipment), and an electronic cabinet assembly which is configured to support the electronic equipment. The electronic cabinet assembly includes a first electronic cabinet frame defining a first set of electronic equipment bays to carry a first portion of the electronic equipment, and a second electronic cabinet frame defining a second set of electronic equipment bays to carry a second portion of the electronic equipment. The electronic cabinet assembly further includes a set of latch subassemblies which is configured to selectively (i) interconnect the first and second electronic cabinet frames, and (ii) disconnect the first and second electronic cabinet frames from each other. Accordingly, a user is capable of conveniently attaching the electronic cabinet frames together using the set of latch subassemblies, and perhaps later separating the electronic cabinet frames, without handling any nuts or bolts.

In some arrangements, the electronic cabinet assembly further includes a set of pins that extend between the first and second electronic cabinet frames (e.g., at a base location of the electronic cabinet assembly) to rigidly maintain positioning of the first and second electronic cabinet frames relative to each other. Accordingly, when the frames are interconnected, the set of pins provides additional support to maintain the frames together. For example, while a user moves the electronic system over junction between a horizontal surface and a ramped surface (such as when rolling the electronic system from a hallway into a room with a raised floor or when rolling the electronic system down a truck ramp onto a horizontal floor surface), the set of pins in combination with the set of latch subassemblies robustly keep the frames in alignment and prevent the frames from splaying.

In some arrangements, the electronic cabinet assembly further includes metallic fabric material disposed between the first and second electronic cabinet frames. The metallic fabric material provides force that pushes the first and second electronic cabinet frames away from each other. Compression of the material tends to minimize or eliminate any possible rattling between the frames as well as provide tension within the latch subassemblies to maintain latching while the latch subassemblies are in their latched states (i.e., when the latch subassemblies interconnect the frames). Moreover, the metallic fabric material operates as an electrical interface between the frames to equalize chassis ground between the frames and to provide electromagnetic interference (EMI) shielding (i.e., the material operates as an EMI gasket between the frames).

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

The invention is directed to techniques for interconnecting electronic cabinet frames using a set of latch subassemblies. Such subassemblies provide a user (e.g., a manufacturer, a customer, etc.) with flexibility to selectively interconnect and disconnect electronic cabinet frames without handling any nuts or bolts. Accordingly, the user has the capability to subsequently separate the electronic cabinet frames to accommodate certain situations (e.g., narrow facilities at an installation location, a reduced demand for large-scale configurations, etc.) as well as to avoid the risks associated with handling loose hardware (e.g., to avoid loosing nuts and bolts during shipping, dropping a nut or a bolt into electronic circuitry, etc.).

Figure 1:
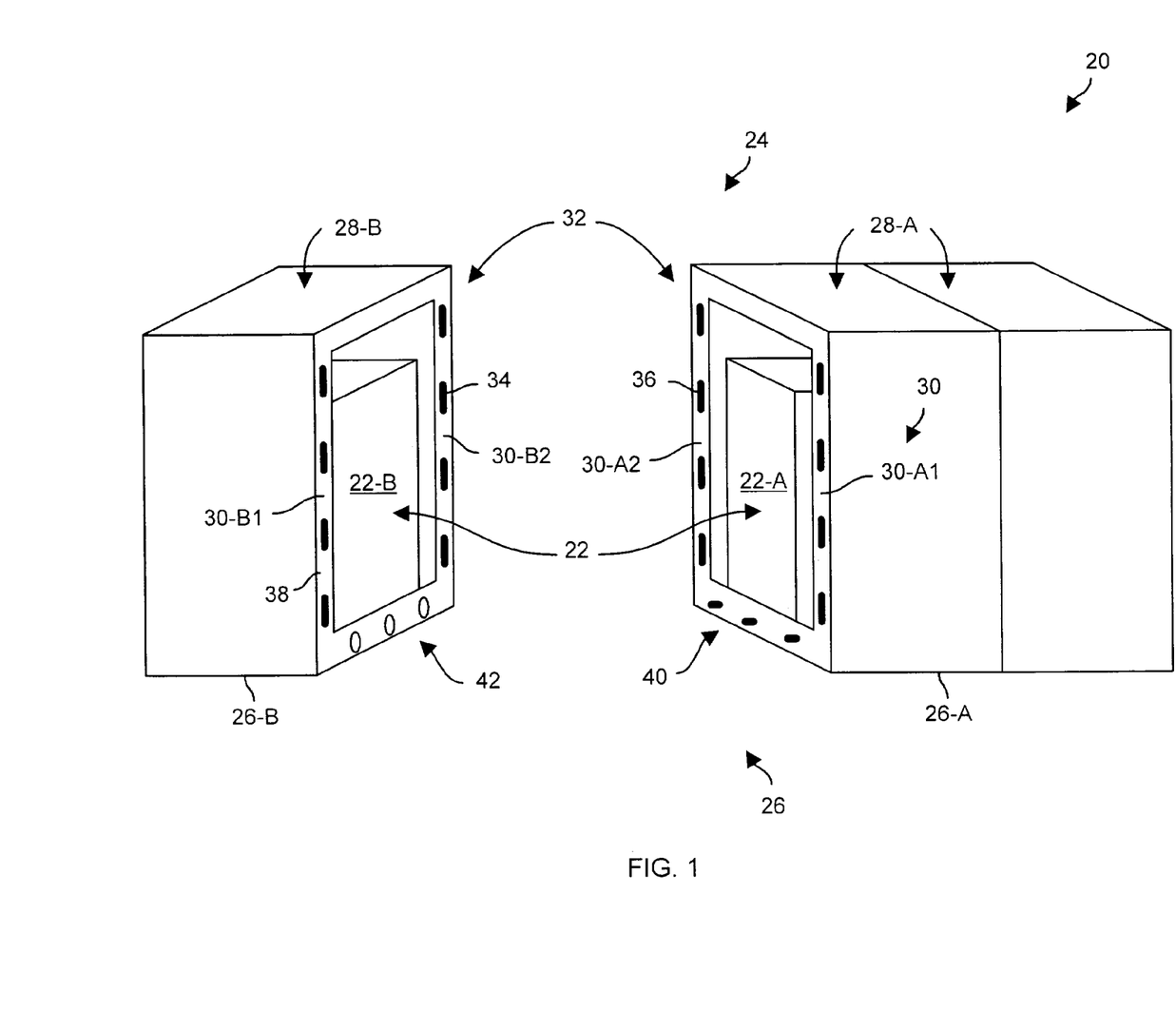
FIG. 1 is a block diagram of an electronic system which is suitable for use by the invention when the electronic system is in an unconnected state.
Figure 2:
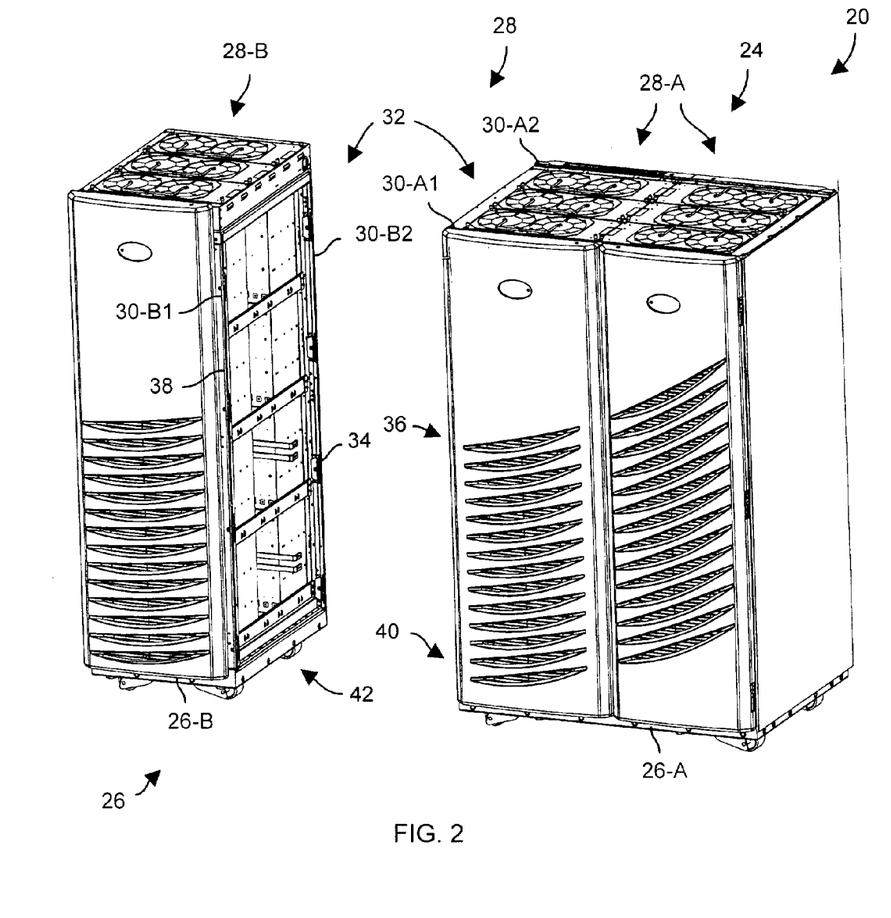
FIG. 2 is a perspective view of the electronic system of FIG. 1 when the electronic system is in the unconnected stated.
Figure 3:
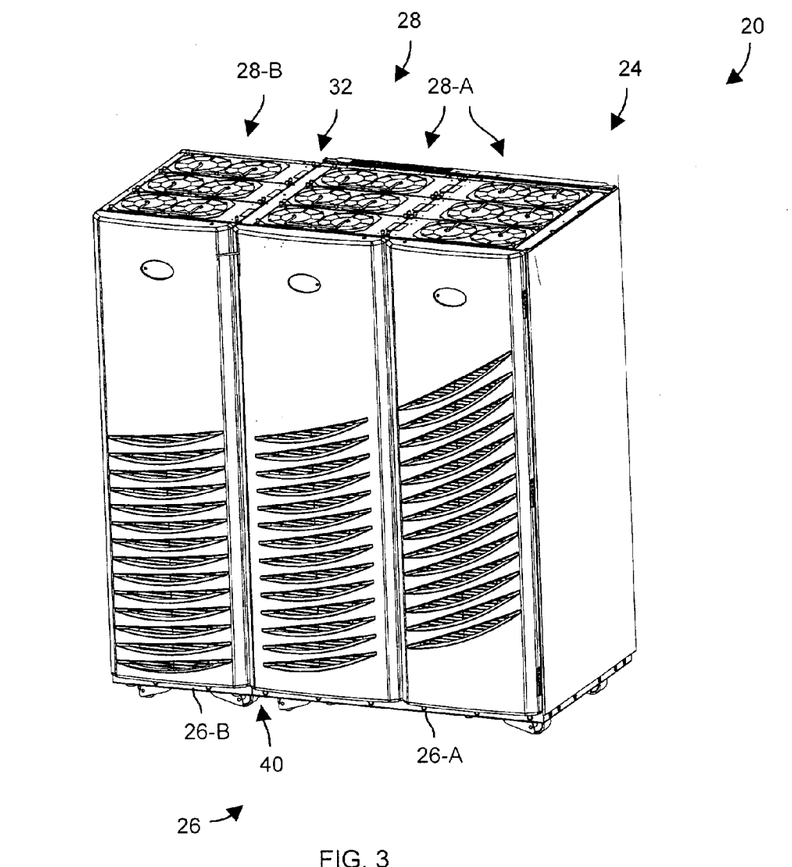
FIG. 3 is a perspective view of the electronic system of FIGS. 1 and 2 in an interconnected state

FIGS. 1–3 show an electronic system 20 which is suitable for use by the invention. FIG. 1 is a general block diagram of the electronic system 20 in an unconnected state. FIG. 2 is a perspective view of the electronic system 20 in the unconnected state. FIG. 3 is a perspective view of the electronic system 20 in the interconnected state.

By way of example only, the electronic system 20 operates as a data storage system which performs a variety of data storage operations on behalf of one or more host computers. To this end, the electronic system 20 includes a set of storage devices (e.g., a set of disk drives), a set of processor modules for carrying out data storage and data retrieval tasks, and a set of network interfaces for handling communications between the set of processor modules and a set of external hosts.

As shown in FIG. 1, the electronic system 20 includes electronic equipment 22 and an electronic cabinet assembly 24 which is configured to support the electronic equipment 22. The electronic cabinet assembly 24 includes a set of electronic cabinet frames 26 for supporting portions of the electronic equipment 22. In particular, the set of electronic cabinet frames 26 includes a first electronic cabinet frame 26-A which defines a first set of electronic equipment bays 28-A to carry a first portion 22-A of the electronic equipment 22 (e.g., a combination of circuit boards and disk drives). Additionally, the electronic cabinet assembly 24 includes a second electronic cabinet frame 26-B which defines a second set of electronic equipment bays 28-B to carry a second portion 22-B of the electronic equipment 22 (e.g., additional disk drives).

Each electronic cabinet frame 26 includes a set of rails 30 (e.g., a set of rigid metallic members) that defines the general structural shape of the electronic cabinet assembly 24. In particular, the first electronic cabinet frame 26-A includes a front vertical rail 30-A1 and a rear vertical rail 30-A2. Similarly, the second electronic cabinet frame 26-B includes a front vertical rail 30-B1 and a rear vertical rail 30-B2. These rails 30-A1, 30-A2, 30-B1, 30-B2 support a set of latch subassemblies 32 which enables the electronic cabinet frames 26-A, 26-B to selectively interconnect with each other and un-connect from each other.

When the electronic system 20 is in the unconnected state (see FIGS. 1 and 2), the electronic cabinet frames 26-A, 26-B are configured to carry side panels to prevent exposure of the electronic equipment 22 housed within the bays 28 (e.g., to prevent the equipment 22 against damage, tampering, etc.). However, when the electronic system 20 is in the interconnected state (FIG. 3), the side panels are removed and the set of latch subassemblies 32 latch the electronic cabinet frames 26-A, 26-B together.

As shown in FIGS. 1 and 2, the latch subassemblies 32 are distributed along the vertical rails 30 of the electronic frames 26. Each latch subassembly 32 includes a tabbed device 34 and a receptacle device 36. In particular, for each latch subassembly 32, the tabbed device 34 of that subassembly 32 mounts to a rail 30 of one frame 26-A, 26-B, and the receptacle device 34 of that subassembly 32 mounts to an opposing vertical rail 30 of the other frame 26-A, 26-B at an adjacent location. In one arrangement, the electronic system 20 includes eight latch subassemblies 32, i.e., four subassemblies 32 along the front rails 30-A1, 30-B1, and another four subassemblies 32 along the back rails 30-A2, 30-B2.

To transition the electronic system 20 to the interconnected state as shown in FIG. 3 from the unconnected state as shown in FIGS. 1 and 2, a user brings the electronic cabinets 24 together and actuates the tabbed device 34 of each latch subassembly 32. For proper alignment, the user positions the frames 26-A, 26-B side-by-side (e.g., by a user rolling the frames 26 over a floor surface) so that individual latch components (i.e., the tabbed device 34 and the receptacle device 36) of the latch subassembly 32 are adjacent to each other. As the user actuates a tabbed device 34 (e.g., as the user rotates a cam of the tabbed device 34), a tab within the tabbed device 34 engages with the receptacle device 36 of that subassembly 32 to hold the two devices 34, 36 together in a locked manner. The user repeats this process for each latch subassembly 32 to fully connect the frames 26 together. As a result, the electronic system 20 is now interconnected in robust and reliable manner.

In one arrangement, the electronic system 20 further includes a gasket 38 which fastens to one of the electronic cabinet frames 26-A, 26-B. The gasket 38 includes compressible metallic fabric material and extends around the side of that electronic cabinet frame 26-A, 26-B and along the rails 30. The gasket 38 is shown in FIG. 2 generally (see the arrow 38) as residing on the surfaces of the electronic cabinet frame 26-B by way of example only.

When the user interconnects the electronic cabinet frames 26-A, 26-B, the user pushes the frames 26-A, 26-B together to compress the gasket 38. As the gasket 38 compresses, the gasket 38 provides a separating force that pushes the electronic cabinet frames 26-A, 26-B away from each other. Such operation tends to reduce or even eliminate rattling between the electronic cabinet frames 26-A, 26-B as well as tends to provide tension (i.e., a snug fit) between tabbed devices 34 and the receptacle devices 36 of the latch subassemblies 32 to enable these components to maintain secure latching. Furthermore, the metallic fabric material within the gasket 38 serves as an electrical conduit between the electronic cabinet frames 26-A, 26-B to equate chassis ground between the electronic cabinet frames 26-A, 26-B and to provide electromagnetic interference (EMI) shielding (i.e., the metallic material operates as an EMI gasket between the frames 26-A, 26-B).

In some arrangements, one electronic cabinet frame 26-A, 26-B further includes a set of pins 40, and the other electronic cabinet frame 26-A, 26-B defines a corresponding set of holes 42. Preferably, the set of pins 40 extend outwardly from a base region of one of the frames 26-A, 26-B toward the set of holes 42 of the other frame 26-A, 26-B when frames 26-A, 26-B are in close position and ready for interconnection. When the user brings the frames 26-A, 26-B together, the pins 36 engage their corresponding holes 42 to properly align the frames 26-A, 26-B relative to each other. The user then latches the latch subassemblies 32 to secure the frames 26 together.

If the electronic system 20 is ever moved while in the interconnected state, the extension of the pins 40 between the frames 26 in combination with the latch subassemblies 32 when latched operate to provide structural cohesion between the frames 26-A, 26-B thus minimizing or even eliminating the possibility of splaying between the frames 26-A, 26-B (e.g., as the electronic system 20 transitions at an angle from one surface to another). Further details of the invention will now be provided with reference to FIG. 4.

Figure 4:
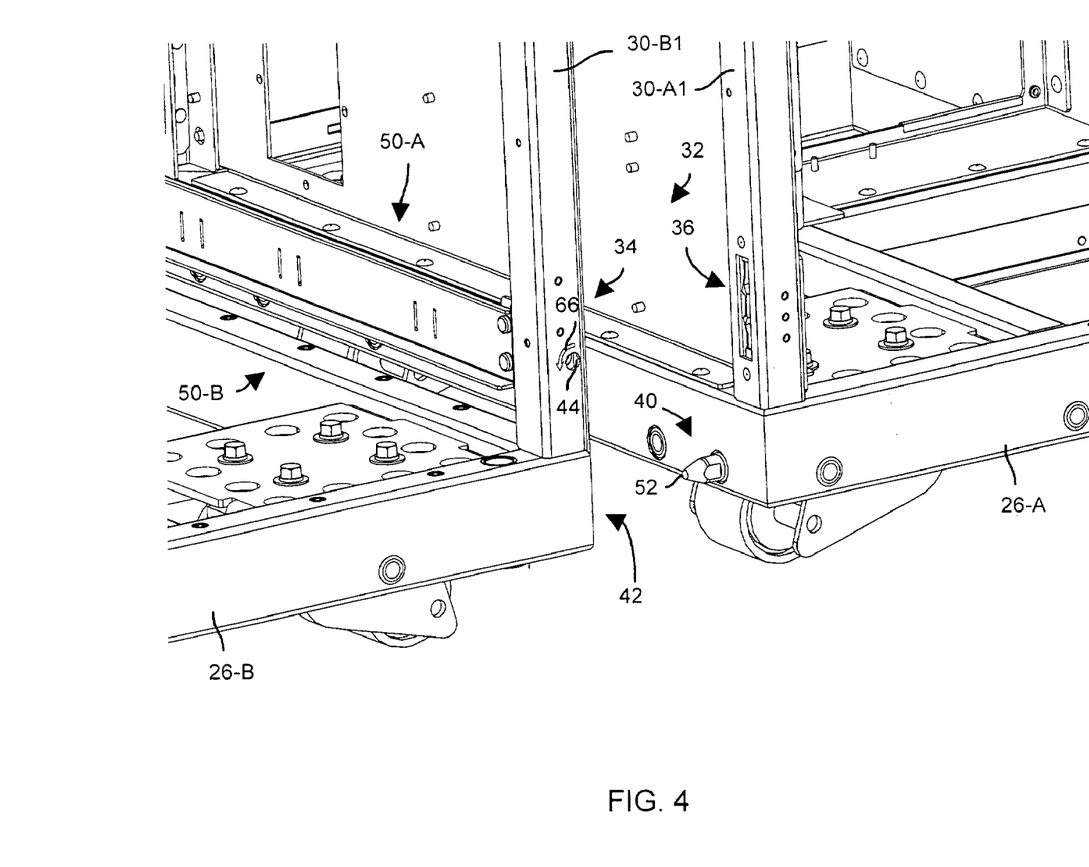
FIG. 4 is a close up view of particular portions of the electronic system of FIGS. 1–3.

FIG. 4 shows a detailed view of bottom portions 50-A, 50-B of the frames 26-A, 26-B. In particular, one of the pins 40 is shown extending outwardly from the frame 26-A toward a corresponding hole 42 defined by the frame 26-B. As shown, the pin 40 tapers to a narrower end 52 which faces outwardly from the frame 26-A to facilitate alignment of the pin 40 into the corresponding hole 42 defined by the frame 26-B. In one arrangement, there a multiple pins 40 (e.g., two, three, etc.) along the bottom portions 50-A, 50-B of the frames 26-A, 26-B for enhanced alignment and strength.

As further shown in FIG. 4, a latch subassembly 32 resides adjacent the bottom portions 50-A, 50-B of the frames 26-A, 26-B. In particular, by way of example only, a tabbed device 34 fastens to the vertical rail 30-B1 of the frame 26-B, and a receptacle device 36 fastens to the vertical rail 30-A1 of the frame 26-A. Preferably, the devices 34, 36 are rigidly secured to the frames 26-A, 26-B (e.g., via rivets, welds, hardware, etc.) so that the devices 34, 36 are essentially extensions of the frames 26-A, 26-B.

Figure 5:
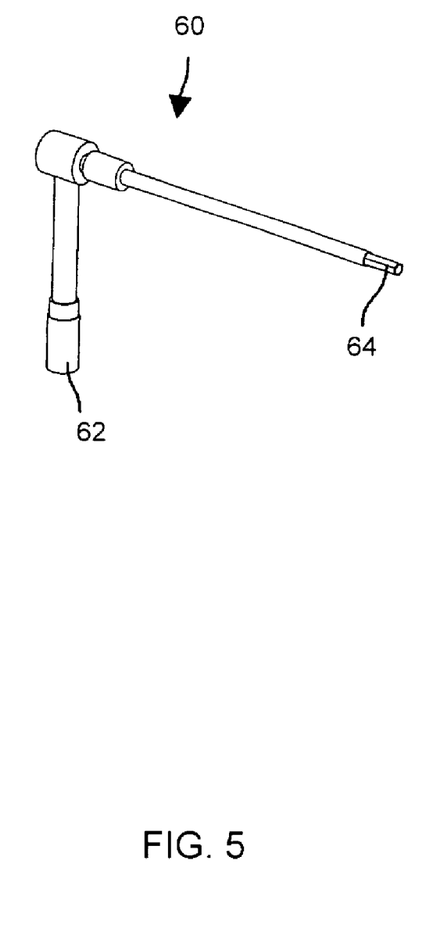
FIG. 5 is a perspective view of a tool which is suitable for placing the electronic system in the interconnected state.

FIG. 5 shows a tool 60 (e.g., a torque wrench) which is suitable for actuating the latch subassemblies 32 between the locked and unlocked states. In particular, the user holds one end 62 of the tool 60 and inserts another end 64 of the tool 60 through a hole 44 in the rail 30 of a frame (see the vertical rail 30-B1). By way of example only, the user rotates the tool in accordance with an arrow 66 which is printed on the rail 30 (see FIG. 4) to move a cam of the tabbed device 34 in a latching direction. Similarly, the user rotates the tool in a direction which is opposite the arrow 66 to move the cam of the tabbed device 34 in an unlatching direction.

In some arrangement, the latching subassemblies 32 require the user to provide rotation in the clockwise direction to latch some of the latch subassemblies 32, and to provide rotation in the counterclockwise direction to latch other latch subassemblies 32. For example, in one arrangement which has four latch subassemblies 32 at the front of the electronic cabinet assembly 24 and four other latch subassemblies 32 at the back of the electronic cabinet assembly 24, two of the four latch subassemblies 32 at the front require clockwise turns for latching, and another two of the four latch subassemblies 32 at the front require counterclockwise turns for latching. Similarly, two of the four latch subassemblies 32 at the back require clockwise turns for latching, and another two of the four latch subassemblies 32 at the back require counterclockwise turns for latching. Further details of the invention will now be provided with reference to FIGS. 6 and 7.

Figure 6:
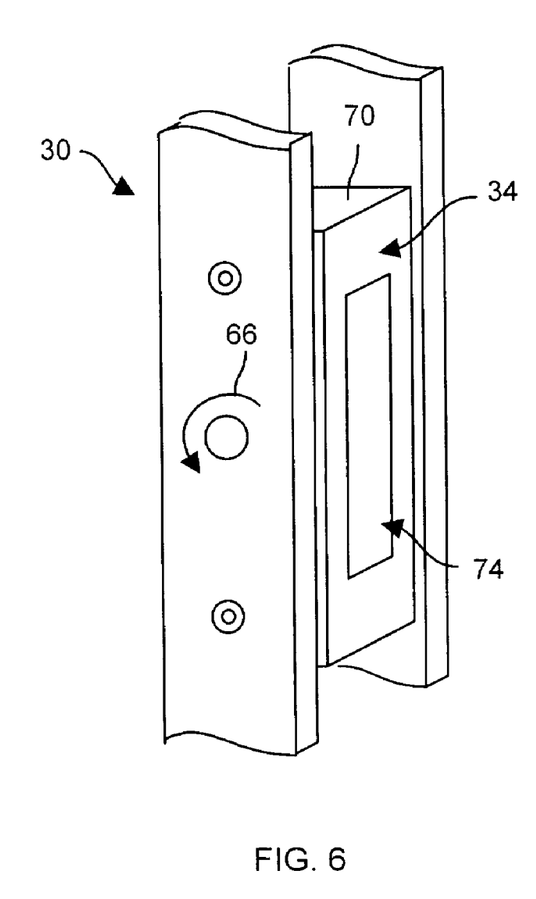
FIG. 6 is a block diagram of a tabbed latch device of the electronic system of FIGS. 1–4 when the tabbed latch device is in an unlatched position.
Figure 7:
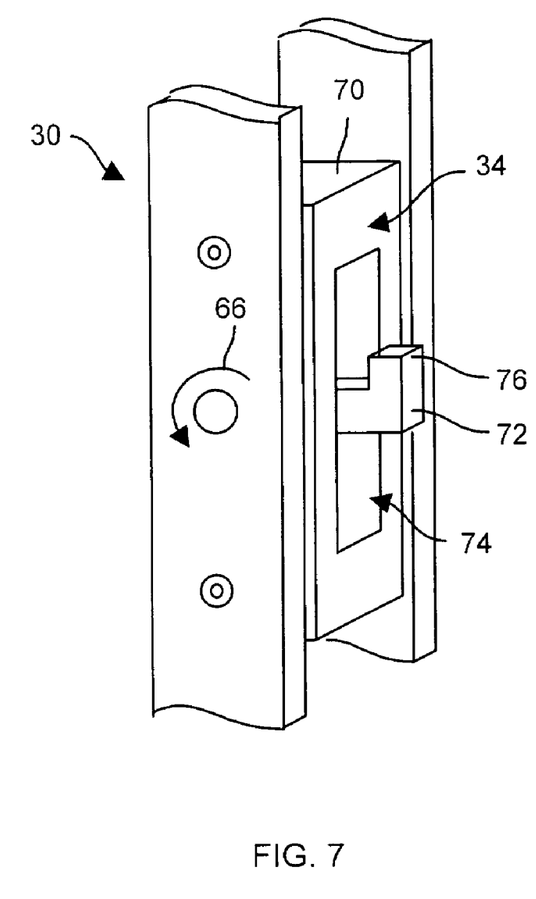
FIG. 7 is a perspective view of the tabbed latch device of FIG. 6 when the tabbed latch device is in a latching position.

FIGS. 6 and 7 show general views of the latch device 34. The latch device 34 has a housing 70 and a tab 72 remains recessed within a cavity 74 defined by housing 70, when the latch device 34 is in an unlatched position (see FIG. 6). In contrast, when the user inserts the tool 60 into the hole of the rail 30 and rotates the tool 60 in the direction of the arrow 66, the tab 72 rotates from the cavity 74 and extends outwardly in order to latch with a corresponding receptacle device 36 (see FIG. 7).

In one arrangement, an end 76 of the tab 72 is tapered (not shown) and a slot defined by the receptacle device 36 for receiving the tab 72 is similarly tapered to provide a snug fit when the user latches the devices 34, 36 together. Such operation tends to provide the user with a feedback response of ever increasing tightness as the user rotates the tool 60. In this arrangement, the tool 60 preferably has a torque feature (e.g., the tool 60 is a torque wrench) so that the user provides consistent force when locking each latch subassembly 32. After the user has latched each latch subassembly 32, the frames 26-A, 26-B are robustly and reliably connected together.

Parts which are similar to the tabbed device 34 and the receptacle device 36 are cam latches which are commonly used on wooden pocket doors. Such devices have a narrow profile which is well-suited for mounting within the frames 26, as well as have durable metal housings to provide the strength necessary to robustly and securely lock the frames 26 together. An example of parts which are suitable for use as the latch subassemblies 32 of the electronic system 20 are the family of cam latches provided by Southco of Concordville, Pa. (e.g., Part No. R2-24).

Figure 8:
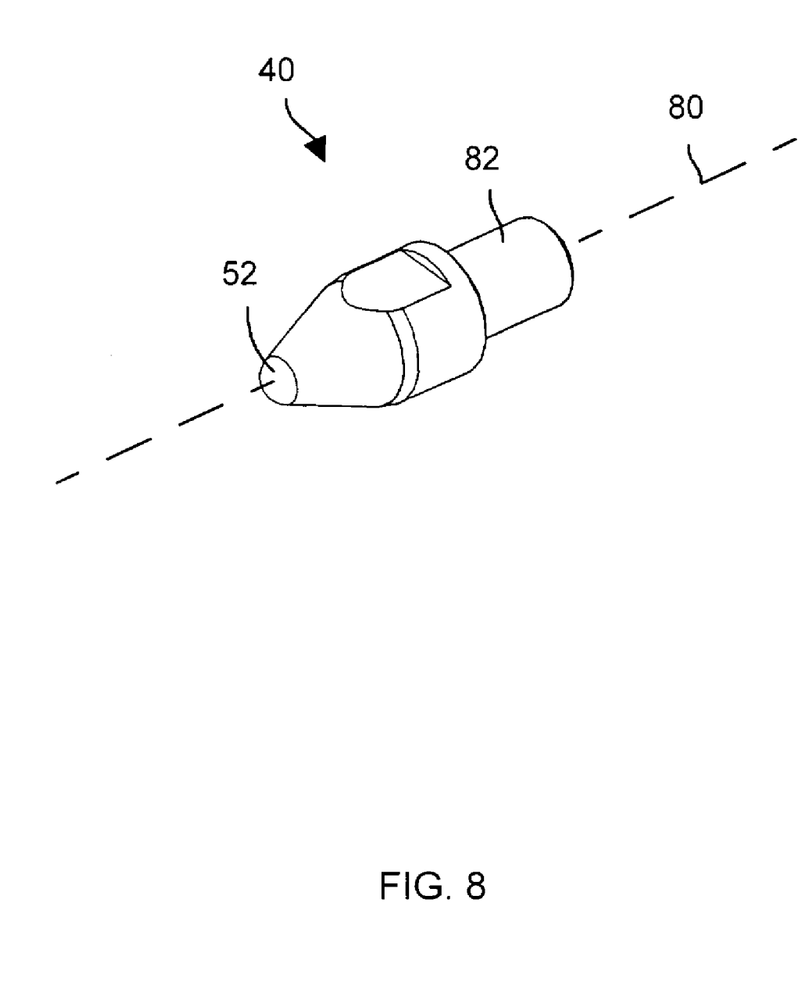
FIG. 8 is a perspective view of a pin of the electronic system of FIGS. 1–4.

FIG. 8 shows a perspective view of a pin 40 of the electronic system 20. The pin 40 has a generally cylindrical cross section around a central axis 80. As mentioned earlier, the pin 40 tapers toward an end 52. When the pin is installed onto a frame 26, the end 52 faces outwardly in order to engage and align with a corresponding frame 26. An opposite end 82 of the pin 52 provides a surface (e.g., an outer threaded surface, an inner threaded surface, etc.) to facilitate mounting of the pin 52 onto the frame 26 (e.g., using hardware, using welding, etc.). Further details of the invention will now be provided with reference to FIG. 9.

Figure 9:
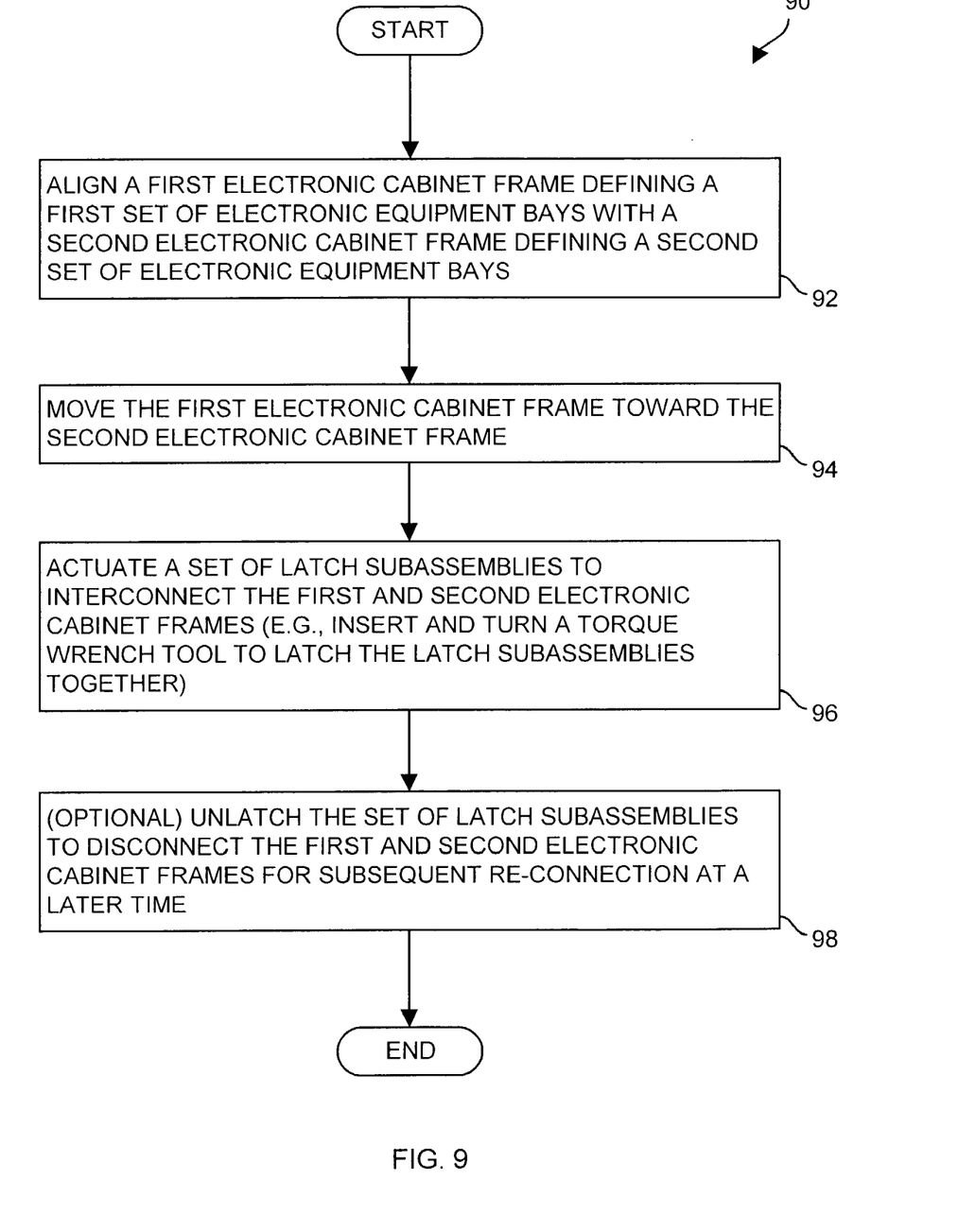
FIG. 9 is a flowchart of a procedure which is performed by a user when operating the electronic system of FIG. 1.

FIG. 9 is a flowchart of a procedure 90 which is performed by a user when operating the electronic system 20. In step 92, the user aligns a first electronic cabinet frame 26 defining a first set of electronic equipment bays 28 with a second electronic cabinet frame 26 defining the second set of electronic equipment bays 28. For example, as shown in FIG. 2, the user moves the electronic cabinet frame 26-B in line with the electronic cabinet frame 26-A.

In step 94, the user moves the first electronic cabinet frame 26 toward the second electronic cabinet frame 26. As the first and second electronic cabinet frames 26 move together, the pins 42 extending from one frame 26 engage holes defined by the other frame 26 to ensure proper alignment (also see FIG. 4). At this point, the individual devices 34, 36 of the latch subassemblies 32 are now properly positioned adjacent to each other for proper latching. Furthermore, the gasket 38 is now somewhat compressed (and may compress still further in the next step) to electrically connect the frames 26 and to provide EMI shielding between the frames 26.

In step 96, the user actuates the latch assemblies 32 to interconnect the first and second electronic cabinet frames 26. In particular, the user inserts and rotates the tool 60 (e.g., in the direction of arrows 66 printed on the frames 26) to actuate the tab 72 of each tabbed device 34 and thus latch each subassembly 32. In one arrangement, the tool 60 is a torque wrench which ensures application of a proper and consistent amount of force when latching the latch subassemblies 32. As a result, the frames 26 are now robustly and reliably latched together (also see FIG. 3). The pins 40 provide additional alignment strength to prevent the frames from splaying.

In contrast to conventional frame fastening approaches which involve welding frames together, the frames 26 of the electronic system 20 are capable of being separated at a future time. That is, as shown by step 98 of FIG. 9, the user may unlatch the latch subassemblies 32 to disconnect the first and second electronic cabinet frames 26. In particular, the user simply inserts and rotates the tool 60 in the opposite direction of the arrows 66 on the frames 26 to unlatch each subassembly 32 and thus separate the frames 26.

It should be understood that there are variety of reasons why the user may later decide to separate the frames 26. For example, if the electronic system 20 is incapable of fitting through a location such as a doorway, a hallway or elevator while in the interconnected state, the user is capable of conveniently separating the electronic system 20 into smaller units (i.e., the individual cabinet portions of the electronic cabinet assembly 24) that will fit through that area without handling any nuts or bolts. Thus, the user avoids the risks associated with handling such hardware (e.g., loosing the nuts and bolts during shipping, damaging circuitry by dropping the nuts and bolts into the equipment) as when using conventional equipment.

Furthermore, the electronic system 20 provides flexibility. For example, the manufacturer may sell the electronic system 20 in sections. That is, a customer may purchase just the electronic cabinet frame 26-A and its associated equipment 22-A until its needs increase. To this end, the manufacturer supplies a panel to cover an opening on the side of the electronic cabinet frame 26-A. When the customer eventually decides to obtain more equipment, the customer may simply purchase the electronic cabinet frame 26-B and its associated equipment 22-B. At this point, the panel is removed to expose the opening on the side of the electronic cabinet frame 26-A, and the two frames 26-A, 26-B are connected using the set of latch subassemblies 32. The electronic equipment 22 within each frame 26 can connect through the exposed cabinet openings using cables, bus bars, etc. Thus, the electronic system 20 is easily scalable and the customer does not need to replace existing any equipment with entirely new equipment when increasing capacity.

Moreover, the manufacturer has flexibility as well. For example, if the manufacturer overestimates the demand for large-scale systems and makes too many electronic systems 20, the manufacturer is capable of separating the electronic systems 20 into smaller-scale units and offering these smaller-scale units individually. That is, the manufacturer may simply sell the frames 26-A and associated equipment 22-A as a smaller-scale fully functioning unit, and sell the frames 26-B and the associated equipment 22-B as an update package to other customers. Therefore, the manufacturer is not stuck with too many large-scale systems which must now be stored and risk obsolescence as with conventional systems.

In summary, the invention is directed to techniques for interconnecting electronic cabinet frames 26 using a set of latch subassemblies 32. Such subassemblies 32 provide a user (e.g., a manufacturer, a customer, etc.) with flexibility to selectively interconnect and disconnect electronic cabinet frames 26 without handling any nuts or bolts. Accordingly, the user has the capability to subsequently separate the electronic cabinet frames 26 to accommodate certain situations (e.g., narrow facilities at an installation location, a reduced demand for large-scale configurations, etc.) as well as to avoid the risks associated with handling loose hardware (e.g., to avoid loosing nuts and bolts during shipping, dropping a nut or a bolt into electronic circuitry, etc.).

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the EMI gasket 38 was described above as residing on the frame 26-B by way of example only. In other arrangements, the EMI gasket 38 resides on the other frame 26-A or on both frames 26-A, 26-B for flexibility.

Additionally, it should be understood that the pins 40 were described as fastening onto the frame 26-A and extending outwardly to engage the frame 26-B by way of example only. In other arrangements, the pins 40 fasten onto the frame 26-B and extend outwardly to engage the frame 26-A. In yet another arrangement, the pins 40 reside on both frames 26-A, 26-B and engage corresponding holes on the opposite frame 26-A, 26-B.

Furthermore, it should be understood that the pins 40 were explained as being fastened to the bottom portions of the frames 26-A, 26-B by way of example only. In other arrangements, additional pins 40 reside on other portions of the frames 26-A, 26-B (e.g., the top, the sides, etc.) for improved alignment and strength.

Additionally, it should be understood that the electronic system 20 was described above as a data storage system by way of example only. In other arrangements, the electronic system 20 performs other duties, e.g., is a general purpose computer system, is a networking system, is specialized equipment, etc.

What is claimed is:

1. A method for interconnecting electronic cabinet frames, the method comprising:
   aligning a first electronic cabinet frame defining a first set of electronic equipment bays with a second electronic cabinet frame defining a second set of electronic equipment bays;
   moving the first electronic cabinet frame toward the second electronic cabinet frame; and
   actuating a set of latch subassemblies to interconnect the first and second electronic cabinet frames;
   wherein each latch subassembly of the set of latch subassemblies includes a first latching device fastened to the first electronic cabinet frame and a second latching device fastened to the second electronic cabinet frame; and
   wherein actuating the set of latch subassemblies includes:
      turning a torque wrench tool such that, for each latch subassembly, a portion of the second latching device of that latch subassembly latches with the first latching device of that latch subassembly.

2. The method of claim 1 wherein the first and second latching devices of each latch subassembly includes metallic material, and wherein turning the torque wrench tool includes:
   forming a set of electrical paths between the first and second electronic cabinet frames.

3. The method of claim 1 wherein the first electronic cabinet frame includes a first vertical front rail and a first vertical rear rail, wherein the second electronic cabinet frame includes a second vertical front rail and a second vertical rear rail, and wherein turning the torque wrench tool includes:
   rotating the torque wrench tool clockwise for two latch subassemblies and rotating the torque wrench tool counter-clockwise for another two latch subassemblies to join the first vertical front rail of the first electronic cabinet frame with the second vertical front rail of the second electronic cabinet frame.

4. The method of claim 1 wherein moving the first electronic cabinet frame toward the second electronic cabinet frame includes:
   coupling the first and second electronic cabinet frames within each other using a set of pins disposed adjacent a base location of the first and second electronic cabinet frames.

5. The method of claim 1 wherein actuating the set of latch subassemblies includes:
   compressing metallic fabric material disposed between the first and second electronic cabinet frames, the metallic fabric material providing a force that pushes the first and second electronic cabinet frames away from each other.

6. The method of claim 1, further comprising:
   unlatching the set of latch subassemblies to disconnect the first and second electronic cabinet frames for subsequent re-connection at a later time.

7. The method of claim 1 wherein the torque wrench tool is configured to apply consistent force onto each latch subassembly when actuating that latch subassembly to interconnect the first and second electronic cabinet frames.

8. The method of claim 7 wherein each of the first electronic cabinet frame and the second electronic cabinet frame includes abutting vertical rails; and wherein each latch subassembly is installed within an abutting vertical rail of the first electronic cabinet frame and an abutting vertical rail of the second electronic cabinet frame.

9. The method of claim 8 where multiple latch subassemblies are installed within each of the abutting vertical rails.

10. The method of claim 1 wherein each of the first electronic cabinet frame and the second electronic cabinet frame includes abutting vertical rails; and wherein each latch subassembly is installed within an abutting vertical rail of the first electronic cabinet frame and an abutting vertical rail of the second electronic cabinet frame.

11. The method of claim 10 where multiple latch subassemblies are installed within each of the abutting vertical rails.

12. A method for interconnecting electronic cabinet frames, the method comprising:
   aligning a first electronic cabinet frame defining a first set of electronic equipment bays with a second electronic cabinet frame defining a second set of electronic equipment bays;
   moving the first electronic cabinet frame toward the second electronic cabinet frame; and
   actuating a set of latch subassemblies to interconnect the first and second electronic cabinet frames;
   each latch subassembly of the set of latch subassemblies including a first latching device fastened to the first electronic cabinet frame and a second latching device fastened to the second electronic cabinet frame;
   actuating the set of latch subassemblies including:
      turning a torque wrench tool such that, for each latch subassembly, a portion of the second latching device of that latch subassembly latches with the first latching device of that latch subassembly;
   the first electronic cabinet frame including a first vertical front rail and a first vertical rear rail;
   the second electronic cabinet frame including a second vertical front rail and a second vertical rear rail; and
   turning the torque wrench tool including:
      rotating the torque wrench tool clockwise for two latch subassemblies and rotating the torque wrench tool counter-clockwise for another two latch subassemblies to join the first vertical front rail of the first electronic cabinet frame with the second vertical front rail of the second electronic cabinet frame.

13. The method of claim 12 wherein the first and second latching devices of each latch subassembly includes metallic material, and wherein turning the torque wrench tool includes:
   forming a set of electrical paths between the first and second electronic cabinet frames.

14. The method of claim 12 wherein moving the first electronic cabinet frame toward the second electronic cabinet frame includes:
   coupling the first and second electronic cabinet frames within each other using a set of pins disposed adjacent a base location of the first and second electronic cabinet frames.

15. The method of claim 12 wherein actuating the set of latch subassemblies includes:
   compressing metallic fabric material disposed between the first and second electronic cabinet frames, the metallic fabric material providing a force that pushes the first and second electronic cabinet frames away from each other.

16. The method of claim 12, further comprising:
   unlatching the set of latch subassemblies to disconnect the first and second electronic cabinet frames for subsequent re-connection at a later time.

17. The method of claim 12 wherein the torque wrench tool is configured to apply consistent force onto each latch subassembly when actuating that latch subassembly to interconnect the first and second electronic cabinet frames.

* * * * *